US012602532B2

(12) United States Patent
Xu et al.

(10) Patent No.: US 12,602,532 B2
(45) Date of Patent: Apr. 14, 2026

(54) AUTOMATED TRANSISTOR-LEVEL PLACEMENT FOR DESIGN OF INTEGRATED CIRCUITS

(71) Applicant: GDM Holding LLC, Mountain View, CA (US)

(72) Inventors: Xiaoqing Xu, Mountain View, CA (US); Dino Ruic, Santa Clara, CA (US)

(73) Assignee: GDM Holding LLC, Mountain View, CA (US)

( * ) Notice: Subject to any disclaimer, the term of this patent is extended or adjusted under 35 U.S.C. 154(b) by 711 days.

(21) Appl. No.: 17/957,621

(22) Filed: Sep. 30, 2022

(65) Prior Publication Data

US 2023/0259689 A1     Aug. 17, 2023

Related U.S. Application Data

(60) Provisional application No. 63/310,675, filed on Feb. 16, 2022.

(51) Int. Cl.
| | |
|---|---|
| *G06F 30/30* | (2020.01) |
| *G06F 30/394* | (2020.01) |
| *G06F 30/398* | (2020.01) |

(52) U.S. Cl.
CPC .......... *G06F 30/398* (2020.01); *G06F 30/394* (2020.01)

(58) Field of Classification Search
CPC ..... G06F 30/398; G06F 30/394; G06F 30/392
See application file for complete search history.

(56) References Cited

U.S. PATENT DOCUMENTS

| | | | |
|---|---|---|---|
| 5,701,255 A | 12/1997 | Fukui et al. | |
| 5,943,486 A | 8/1999 | Fukui et al. | |
| (Continued) | | | |

FOREIGN PATENT DOCUMENTS

| | | |
|---|---|---|
| CN | 1834969 A | 9/2006 |
| CN | 107315849 A | 11/2017 |
| (Continued) | | |

OTHER PUBLICATIONS

International Search Report and Written Opinion, mailed May 24, 2023, in corresponding International Patent Application No. PCT/US2023/012431, filed Feb. 6, 2023, 8 pages.
(Continued)

*Primary Examiner* — Jack Chiang
*Assistant Examiner* — Brandon Bowers
(74) *Attorney, Agent, or Firm* — Botos Churchill IP Law LLP

(57)     ABSTRACT

In some embodiments, a computer-implemented method for designing an integrated circuit using transistor placement optimization is provided. A computing system receives a specification for the integrated circuit. The specification includes a netlist describing a plurality of transistors and connections between terminals of the plurality of transistors. The computing system determines an initial location and an orientation on a canvas for each transistor in the plurality of transistors. The computing system uses an objective function based at least in part on the initial locations and the orientations of the plurality of transistors to generate a rough placement having globally optimized locations and orientations for the plurality of transistors. The computing system uses a local refinement technique to optimize the rough placement to generate a fine placement, and uses a routing technique to generate a routing for the fine placement to generate a completed design.

20 Claims, 8 Drawing Sheets

(56)  References Cited

U.S. PATENT DOCUMENTS

| | | | | | |
|---|---|---|---|---|---|
| 5,984,510 | A | * | 11/1999 | Guruswamy | G06F 30/39 716/135 |
| 5,987,086 | A | * | 11/1999 | Raman | G06F 30/394 716/120 |
| 6,006,024 | A | * | 12/1999 | Guruswamy | G06F 30/39 716/54 |
| 6,209,123 | B1 | * | 3/2001 | Maziasz | G06F 30/39 716/135 |
| 6,239,607 | B1 | * | 5/2001 | Maxwell | G01R 31/2846 714/733 |
| 10,318,656 | B2 | | 6/2019 | Cox et al. | |
| 2005/0188338 | A1 | | 8/2005 | Kroyan et al. | |
| 2008/0198236 | A1 | | 8/2008 | Morishita et al. | |
| 2011/0023006 | A1 | * | 1/2011 | Giffel | G06F 30/394 716/139 |
| 2012/0266124 | A1 | * | 10/2012 | Alpert | G06F 30/392 716/122 |
| 2016/0026749 | A1 | | 1/2016 | Song et al. | |
| 2020/0104459 | A1 | | 4/2020 | Tong et al. | |
| 2021/0357561 | A1 | | 11/2021 | Yu et al. | |

FOREIGN PATENT DOCUMENTS

| | | | |
|---|---|---|---|
| CN | 108287932 | A | 7/2018 |
| CN | 110991138 | A | 4/2020 |
| CN | 111767689 | A | 10/2020 |
| JP | 3014646 | B2 | 2/2000 |
| JP | 2000195958 | A | 7/2000 |
| JP | 2008236732 | A | 10/2008 |
| JP | 2009181185 | A | 8/2009 |
| JP | 2010003491 | A | 1/2010 |
| KR | 1020210142543 | A | 11/2021 |

OTHER PUBLICATIONS

Notice of Allowance for Japanese Patent Application No. 2024-548440, Feb. 18, 2025, 5 Pages.

The First Office Action for Chinese Patent Application No. 202380020351.6, Mar. 12, 2025, 14 Pages.

Gupta, A., et al., "Optimal 2-D Cell Layout with Integrated Transistor Folding," IEEE/ACM International Conference on Computer-Aided Design, Nov. 8-12, 1998, pp. 128-135.

Cong, J., et al., "A Thermal-Driven Floorplanning Algorithm for 3D ICs," IEEE/ACM International Conference on Computer Aided Design, Nov. 7-11, 2004, 8 pages.

Kahng, A.B., et al., "Supply Voltage Degradation Aware Analytical Placement," Proceedings of the 2005 International Conference on Computer Design, Oct. 2-5, 2005, 7 pages.

Kahng, A.B., et al. "Analytical Thermal Placement for VLSI Lifetime Improvement and Minimum Performance Variation," 2007 25th International Conference on Computer Design, Oct. 7-10, 2007, 8 pages.

The Extended European Search Report for European Patent Application No. 23756765.6, Nov. 5, 2025, 10 Pages.

Gopalakrishnan, et al., "Direct Transistor-Level Layout for Digital Blocks", Carnegie Mellon University, Pittsburgh, PA, 2001, pp. 577-584.

Hsu, et al., "TransPlace: A Scalable Transistor-Level Placer for VLSI Beyond Standard-Cell-Based Design", IEEE, 2024, 979-8-3503-9354-5/24, pp. 312-318.

Lazzari, et al., "A Transistor Placement Technique Using Genetic Algorithm and Analytical Programming", 2005, vol. 240, VLSI-SoC: From Systems to Silicon, pp. 331-344.

Riepe, et al., "Transistor Level Micro-Placement and Routing for Two-Dimensional Digital VLSI Cell Synthesis", Proceedings of the International Symposium on Physical Design, 1999, DOI: 10.1145/299996.300028, pp. 74-81.

* cited by examiner

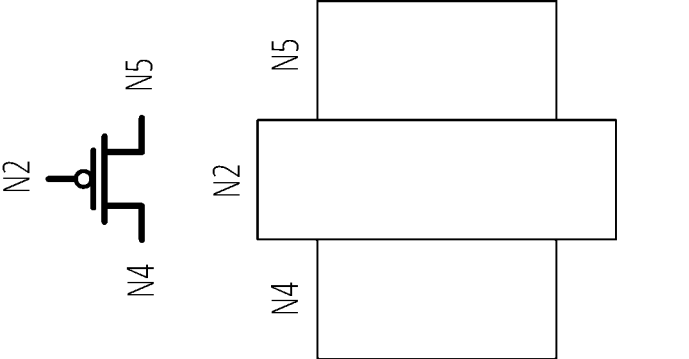
PMOS TRANSISTOR
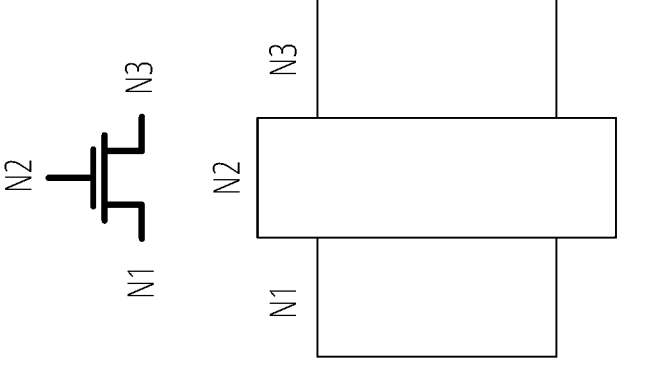
NMOS TRANSISTOR
FIG. 1

Figure 4:
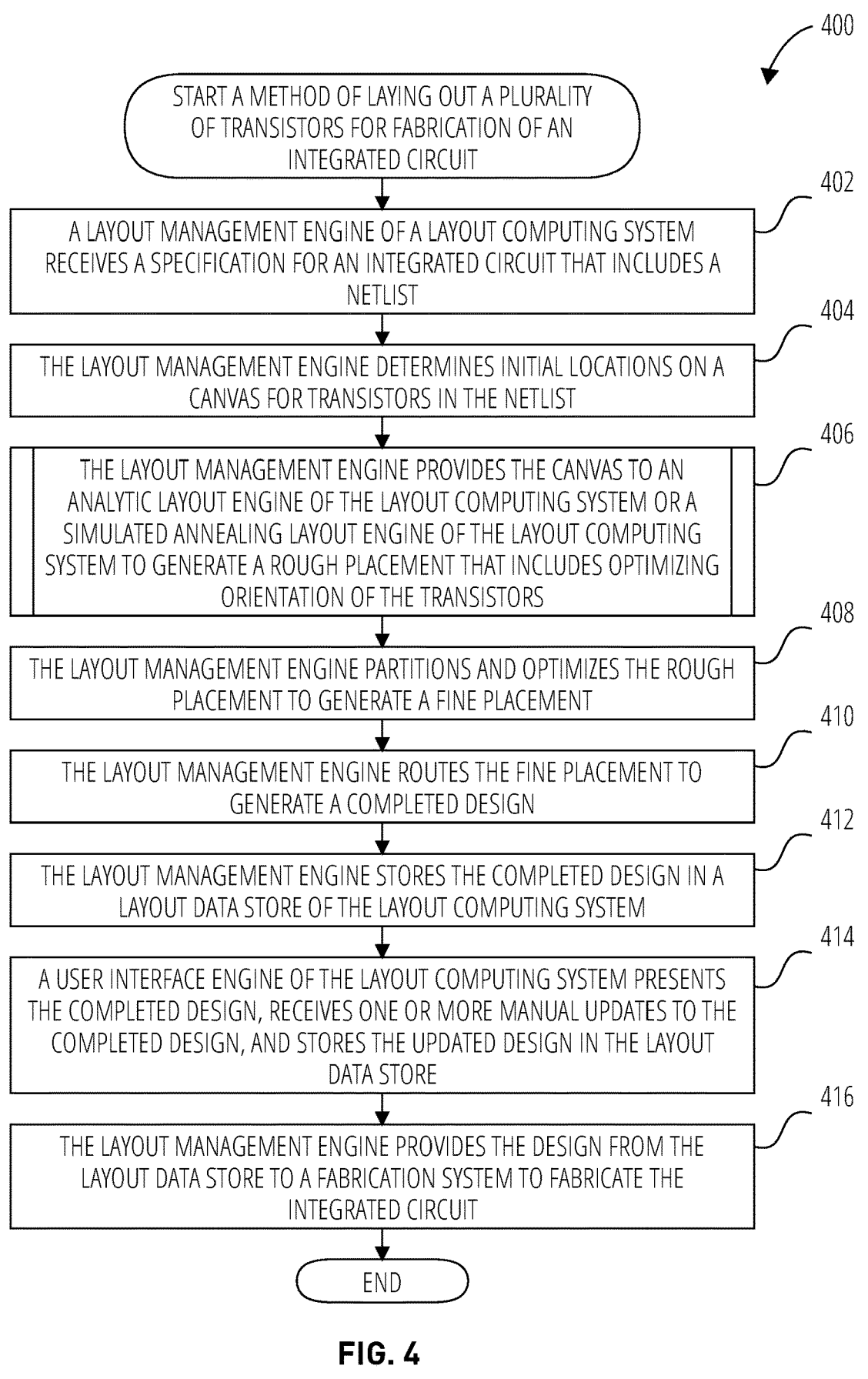

400

START A METHOD OF LAYING OUT A PLURALITY OF TRANSISTORS FOR FABRICATION OF AN INTEGRATED CIRCUIT

402

A LAYOUT MANAGEMENT ENGINE OF A LAYOUT COMPUTING SYSTEM RECEIVES A SPECIFICATION FOR AN INTEGRATED CIRCUIT THAT INCLUDES A NETLIST

404

THE LAYOUT MANAGEMENT ENGINE DETERMINES INITIAL LOCATIONS ON A CANVAS FOR TRANSISTORS IN THE NETLIST

406

THE LAYOUT MANAGEMENT ENGINE PROVIDES THE CANVAS TO AN ANALYTIC LAYOUT ENGINE OF THE LAYOUT COMPUTING SYSTEM OR A SIMULATED ANNEALING LAYOUT ENGINE OF THE LAYOUT COMPUTING SYSTEM TO GENERATE A ROUGH PLACEMENT THAT INCLUDES OPTIMIZING ORIENTATION OF THE TRANSISTORS

408

THE LAYOUT MANAGEMENT ENGINE PARTITIONS AND OPTIMIZES THE ROUGH PLACEMENT TO GENERATE A FINE PLACEMENT

410

THE LAYOUT MANAGEMENT ENGINE ROUTES THE FINE PLACEMENT TO GENERATE A COMPLETED DESIGN

412

THE LAYOUT MANAGEMENT ENGINE STORES THE COMPLETED DESIGN IN A LAYOUT DATA STORE OF THE LAYOUT COMPUTING SYSTEM

414

A USER INTERFACE ENGINE OF THE LAYOUT COMPUTING SYSTEM PRESENTS THE COMPLETED DESIGN, RECEIVES ONE OR MORE MANUAL UPDATES TO THE COMPLETED DESIGN, AND STORES THE UPDATED DESIGN IN THE LAYOUT DATA STORE

416

THE LAYOUT MANAGEMENT ENGINE PROVIDES THE DESIGN FROM THE LAYOUT DATA STORE TO A FABRICATION SYSTEM TO FABRICATE THE INTEGRATED CIRCUIT

END

Figure 6:
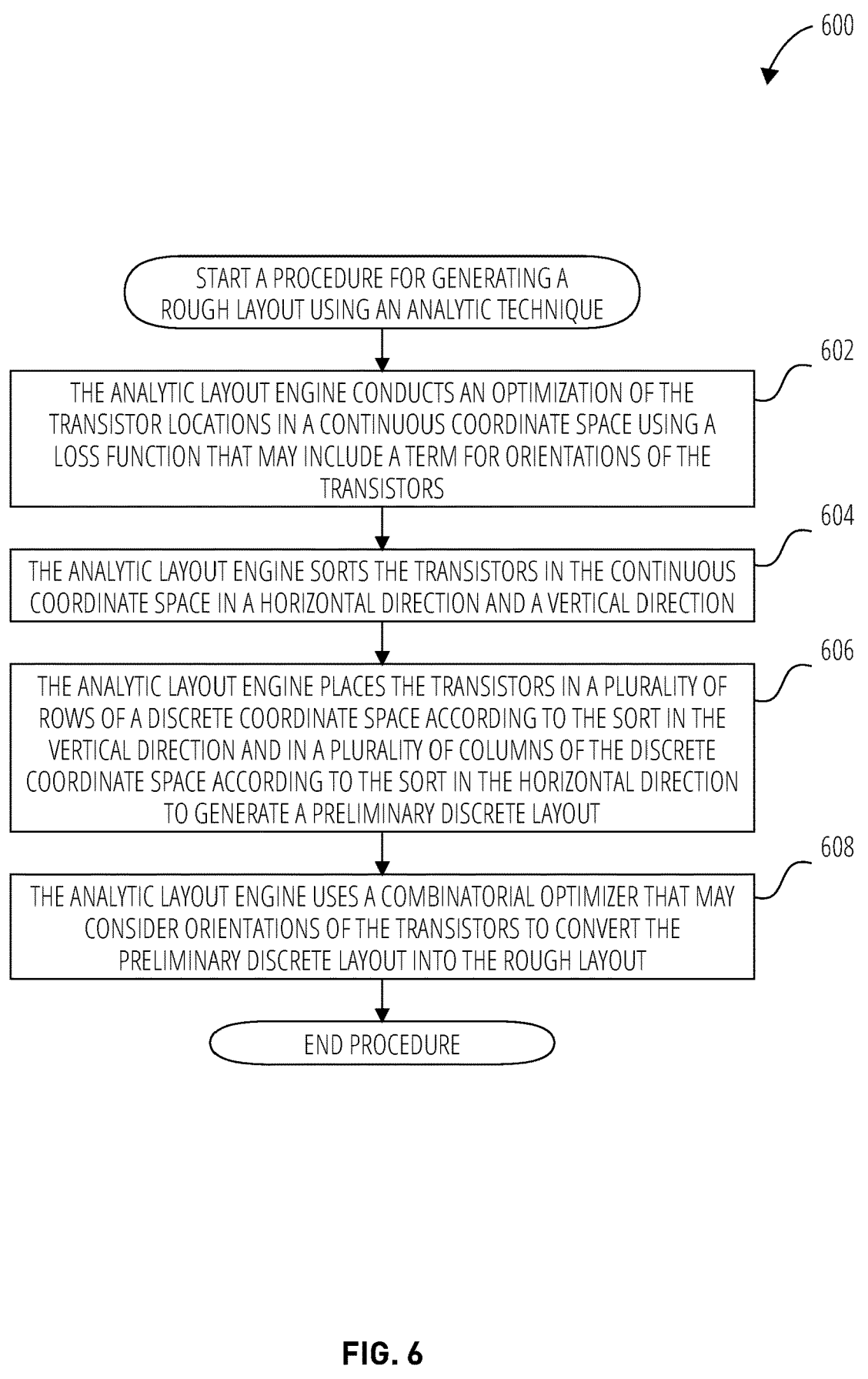

START A PROCEDURE FOR GENERATING A
ROUGH LAYOUT USING AN ANALYTIC TECHNIQUE

602

THE ANALYTIC LAYOUT ENGINE CONDUCTS AN OPTIMIZATION OF THE
TRANSISTOR LOCATIONS IN A CONTINUOUS COORDINATE SPACE USING A
LOSS FUNCTION THAT MAY INCLUDE A TERM FOR ORIENTATIONS OF THE
TRANSISTORS

604

THE ANALYTIC LAYOUT ENGINE SORTS THE TRANSISTORS IN THE CONTINUOUS
COORDINATE SPACE IN A HORIZONTAL DIRECTION AND A VERTICAL DIRECTION

606

THE ANALYTIC LAYOUT ENGINE PLACES THE TRANSISTORS IN A PLURALITY OF
ROWS OF A DISCRETE COORDINATE SPACE ACCORDING TO THE SORT IN THE
VERTICAL DIRECTION AND IN A PLURALITY OF COLUMNS OF THE DISCRETE
COORDINATE SPACE ACCORDING TO THE SORT IN THE HORIZONTAL DIRECTION
TO GENERATE A PRELIMINARY DISCRETE LAYOUT

608

THE ANALYTIC LAYOUT ENGINE USES A COMBINATORIAL OPTIMIZER THAT MAY
CONSIDER ORIENTATIONS OF THE TRANSISTORS TO CONVERT THE
PRELIMINARY DISCRETE LAYOUT INTO THE ROUGH LAYOUT

END PROCEDURE

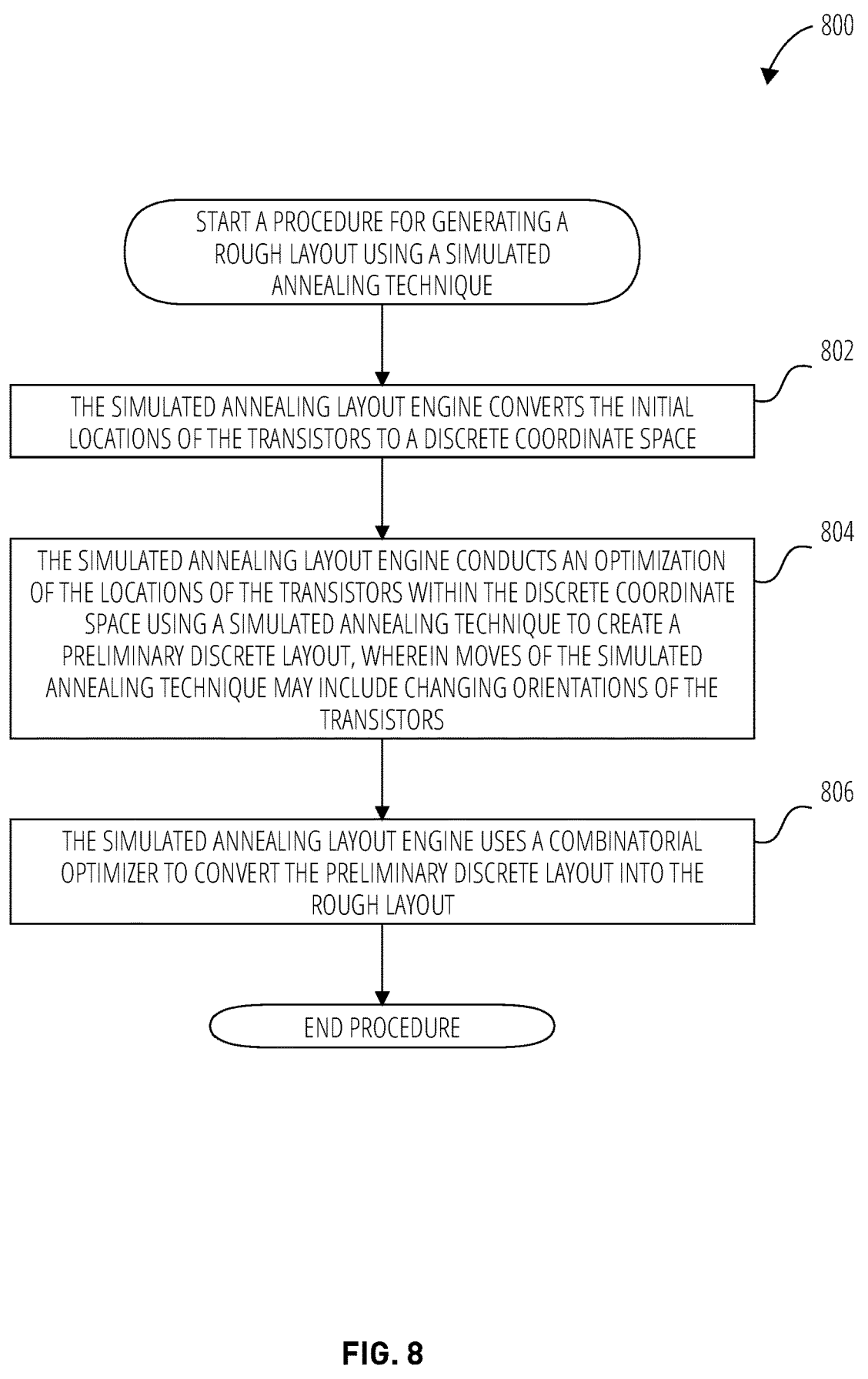

START A PROCEDURE FOR GENERATING A
ROUGH LAYOUT USING A SIMULATED
ANNEALING TECHNIQUE

802

THE SIMULATED ANNEALING LAYOUT ENGINE CONVERTS THE INITIAL
LOCATIONS OF THE TRANSISTORS TO A DISCRETE COORDINATE SPACE

804

THE SIMULATED ANNEALING LAYOUT ENGINE CONDUCTS AN OPTIMIZATION
OF THE LOCATIONS OF THE TRANSISTORS WITHIN THE DISCRETE COORDINATE
SPACE USING A SIMULATED ANNEALING TECHNIQUE TO CREATE A
PRELIMINARY DISCRETE LAYOUT, WHEREIN MOVES OF THE SIMULATED
ANNEALING TECHNIQUE MAY INCLUDE CHANGING ORIENTATIONS OF THE
TRANSISTORS

806

THE SIMULATED ANNEALING LAYOUT ENGINE USES A COMBINATORIAL
OPTIMIZER TO CONVERT THE PRELIMINARY DISCRETE LAYOUT INTO THE
ROUGH LAYOUT

END PROCEDURE

FIG. 8

AUTOMATED TRANSISTOR-LEVEL PLACEMENT FOR DESIGN OF INTEGRATED CIRCUITS

CROSS-REFERENCE TO RELATED APPLICATION

This application claims the benefit of Provisional Application No. 63/310,675, filed Feb. 16, 2022, the entire disclosure of which is hereby incorporated by reference herein for all purposes.

TECHNICAL FIELD

This disclosure relates generally to techniques for integrated circuit design, and in particular though not exclusively to iterative optimization of transistor placement in integrated circuit layouts.

BACKGROUND

Conventional approaches for integrated circuit design include rules-based placement engines, referring to one or more software applications that determine optimum or near-optimum placement of standard cells or hard macros, rather than individual transistors. In the context of integrated circuit design, a standard cell describes a group of transistor and interconnect structures that provides a boolean logic function (e.g., AND, OR, XOR, XNOR, inverters) or a storage function (flipflop or latch). Similarly, "hard macro" refers to block level arrangements of transistors that are pre-validated for a given semiconductor manufacturing process (e.g., in terms of design rules). In this way, conventional transistor placement operates at a hierarchical level above individual transistors, where each object to be placed is either a standard cell or a hard macro and each net denotes the logic connection among various input/output pins associated with the objects (cells or macros) or input/output of the design, rather than individual transistors. Individual transistors, therefore, are placed in reference to the placement of their respective standard cells or macros. Furthermore, net routing is already determined for those transistors that do not host a connection outside the standard cell or macro.

Analytical formulations, such as quadratic programming and nonlinear programming, have become mainstream solutions within commercial tool chains to deal with standard-cell-based designs. The emphasis on standard cell or hard macro level placement results in an unmet need for formulations to facilitate designs at the transistor level directly and automatically. Transistor level placement has been explored for the layout of standard cells and hard macros, where standard cells typically are at a relatively small scale (<100) in terms of transistor count, object count, and/or net count. Even so, conventional techniques for rules-based placement engines largely ignore analytical formulations in favor of graph-based search or combinatorial solvers. There remains a need, therefore, for a transistor-level placement engine for integrated circuit design that is configured to optimize individual transistor placement with respect to one or more analytical objectives and that can operate automatically (e.g., without human intervention).

BRIEF SUMMARY

In some embodiments, a computer-implemented method for designing an integrated circuit using transistor placement optimization is provided. A computing system receives a specification for the integrated circuit. The specification includes a netlist describing a plurality of transistors and connections between terminals of the plurality of transistors. The computing system determines an initial location and an orientation on a canvas for each transistor in the plurality of transistors. The computing system uses an objective function based at least in part on the initial locations and the orientations of the plurality of transistors to generate a rough placement having globally optimized locations and orientations for the plurality of transistors. The computing system uses a local refinement technique to optimize the rough placement to generate a fine placement. The computing system uses a routing technique to generate a routing for the fine placement to generate a completed design. The computing system stores the completed design in a layout data store.

In some embodiments, a non-transitory computer-readable medium having computer-executable instructions stored thereon is provided. The instructions, in response to execution by one or more processors of a computing system, cause the computing system to perform actions for designing an integrated circuit using transistor placement optimization, the actions comprising: receiving, by the computing system, a specification for the integrated circuit, wherein the specification includes a netlist describing a plurality of transistors and connections between terminals of the plurality of transistors; determining, by the computing system, an initial location and an orientation on a canvas for each transistor in the plurality of transistors; using, by the computing system, an objective function based at least in part on the initial locations and the orientations of the plurality of transistors to generate a rough placement having globally optimized locations and orientations for the plurality of transistors; using, by the computing system, a local refinement technique to optimize the rough placement to generate a fine placement; using, by the computing system, a routing technique to generate a routing for the fine placement to generate a completed design; and storing, by the computing system, the completed design in a layout data store.

BRIEF DESCRIPTION OF THE DRAWINGS

Non-limiting and non-exhaustive embodiments of the invention are described with reference to the following figures, wherein like reference numerals refer to like parts throughout the various views unless otherwise specified. Not all instances of an element are necessarily labeled so as not to clutter the drawings where appropriate. The drawings are not necessarily to scale, emphasis instead being placed upon illustrating the principles being described.

FIG. 1 is a schematic diagram of NMOS and PMOS transistors, in accordance with embodiments of the present disclosure.

FIG. 4 is a flowchart that illustrates a non-limiting example embodiment of a method of laying out a plurality of transistors for fabrication of an integrated circuit according to various aspects of the present disclosure.

FIG. 6 illustrates a non-limiting example embodiment of a procedure for generating a rough layout using analytic techniques according to various aspects of the present disclosure.

FIG. 8 is a flowchart that illustrates a non-limiting example embodiment of a procedure for generating a rough layout using a simulated annealing technique according to various aspects of the present disclosure.

DETAILED DESCRIPTION

Embodiments of a computer-implemented method for transistor-level object placement described herein provide improved flexibility and control over transistor placement in integrated circuit layouts relative to standard-cell and hard macro-based approaches, which can in turn improve optimization of custom integrated circuits at the level of individual or arbitrarily grouped transistors.

FIG. 1 is a schematic diagram of NMOS and PMOS transistors, in accordance with embodiments of the present disclosure. Techniques for transistor placement can be implemented automatically and can include techniques for large-scale transistor-level placement to achieve a globally optimized solution. For such a formulation, it can be assumed that each object can be a transistor or an arbitrary group of transistors (rather than being restricted to a functional or manufacturable grouping) and each net denotes the logic connection among various input/output pins associated with the transistors or grouped transistors or input/output of the design.

As shown in FIG. 1, transistors are multi-terminal devices, such as the 3-terminal NMOS and PMOS transistors illustrated. As part of the design, each terminal of a transistor is connected to a respective net, such as n1, n2, . . . n5. In some embodiments, individual nets can be connected to multiple transistors, as shown with n2. In this way, a group of n transistors can be associated with a number of nets from n to 3n. The group of transistors, in contrast to a standard cell or a hard macro, can describe a hierarchical optimization strategy that segments a transistor placement matrix (e.g., the transistor placement matrix of FIG. 2) into smaller groups, for example, for parallelization or optimization of compute resources (e.g., in the context of a distributed computing system, graphical processing unit (GPU), or other parallel computing resource).

Figure 2:
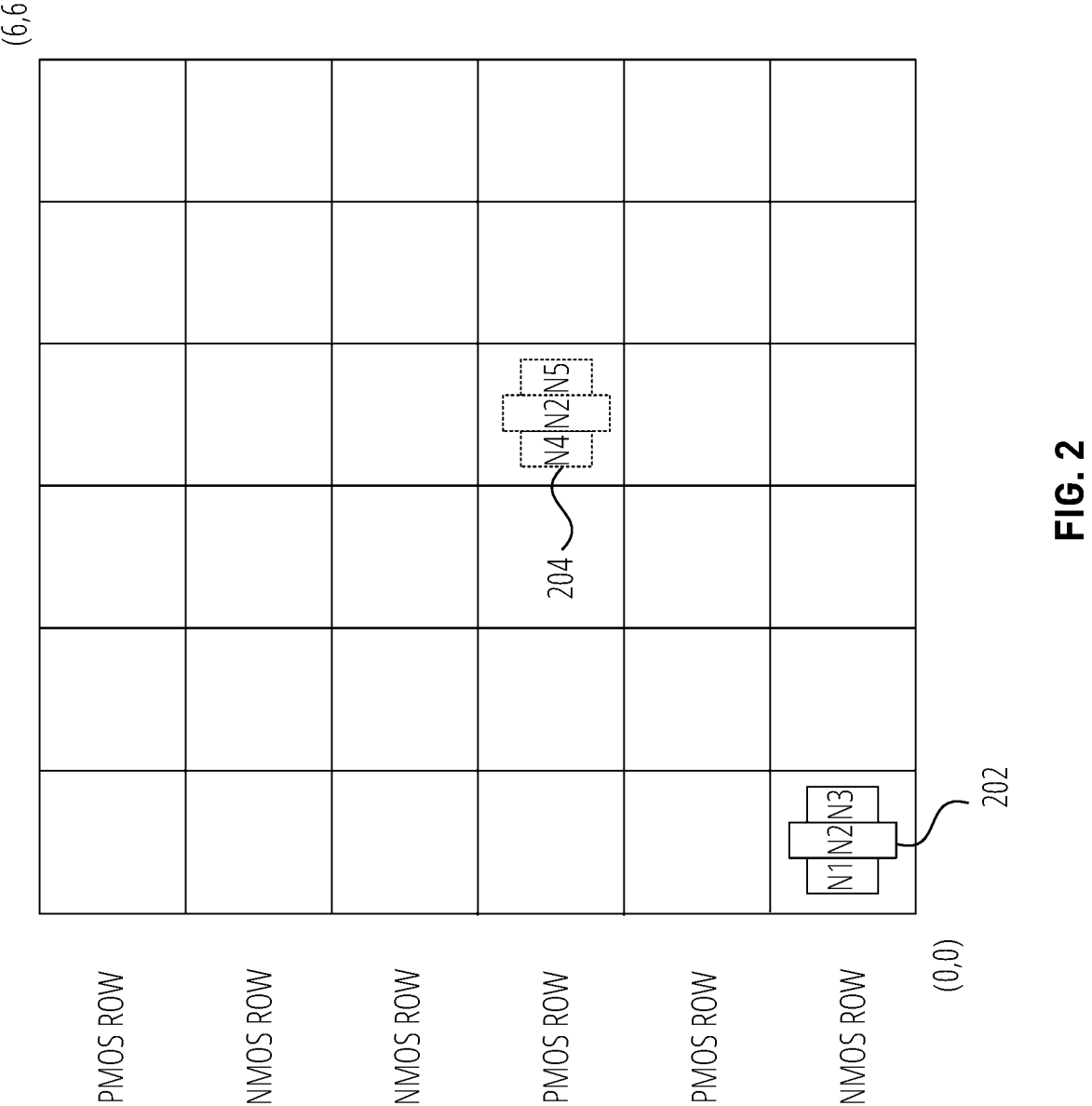
FIG. 2 is a schematic diagram of a transistor placement matrix, in accordance with embodiments of the present disclosure.

As illustrated, material properties of individual transistors can also inform placement decisions described in reference to FIG. 2. For example, a transistor can be N-type or P-type (e.g., NMOS or PMOS), and these two types of transistors may be used in a single integrated circuit to create a CMOS integrated circuit. As shown in FIG. 2, a given type of transistor can be limited to a specific region or regions of a transistor placement matrix.

FIG. 2 is a schematic diagram of a transistor placement matrix, in accordance with embodiments of the present disclosure. The transistor placement matrix is an example of a discretized data structure that organizes a set of transistors according to coordinates in one or more dimensions and/or partial dimensions of a coordinate space (partial dimensions refers to coded dimensions that constrain the placement of a given transistor to a subset of coordinates). The coordinate space, in turn, can be mapped to a physical space on a CMOS substrate as part of semiconductor integrated circuit manufacturing. In this way, by optimizing transistor placement in this discretized coordinate space, the layout of transistors and nets in an integrated circuit can be improved with respect to one or more objectives.

As shown, the transistor placement matrix can correspond to a discretized cartesian coordinate space (e.g., quantized x-y space). In this scheme, an arbitrary $i^{th}$ transistor is located at $(x_i, y_i)$. As shown, a set of transistors can include an NMOS 202 at coordinate (0, 0) illustrated in solid lines, and a PMOS 204 at coordinate (3,2) illustrated in dashed lines.

Optimizations of the locations of the set of transistors in the transistor placement matrix can help improve the performance, reliability, cost, and manufacturability of the resultant integrated circuit. However, typical transistor-level optimization techniques use combinatorial methods that do not scale past small total numbers of transistors (e.g., on the order of 100 transistors), which is perhaps one reason why optimization techniques have not been widely applied in the past at the transistor-level instead of at the less-numerous cell-level. While optimization techniques can still be used on smaller partitions of the transistor placement matrix, it is not likely that a globally optimal solution will be found without considering the entire transistor placement matrix at once.

In embodiments of the present disclosure, optimization techniques are provided that can be efficiently applied to all of the components specified in a netlist (instead of requiring operation on a smaller partition) in order to generate an optimal rough layout in a discretized placement matrix. The rough layout may then be partitioned and processed using traditional methods in order to create an optimal layout for providing to a fabrication system. By first creating the rough layout using a technique that considers an optimal solution for the entire layout as a whole before optimizing the partitions, a better overall layout is achieved.

Figure 3:
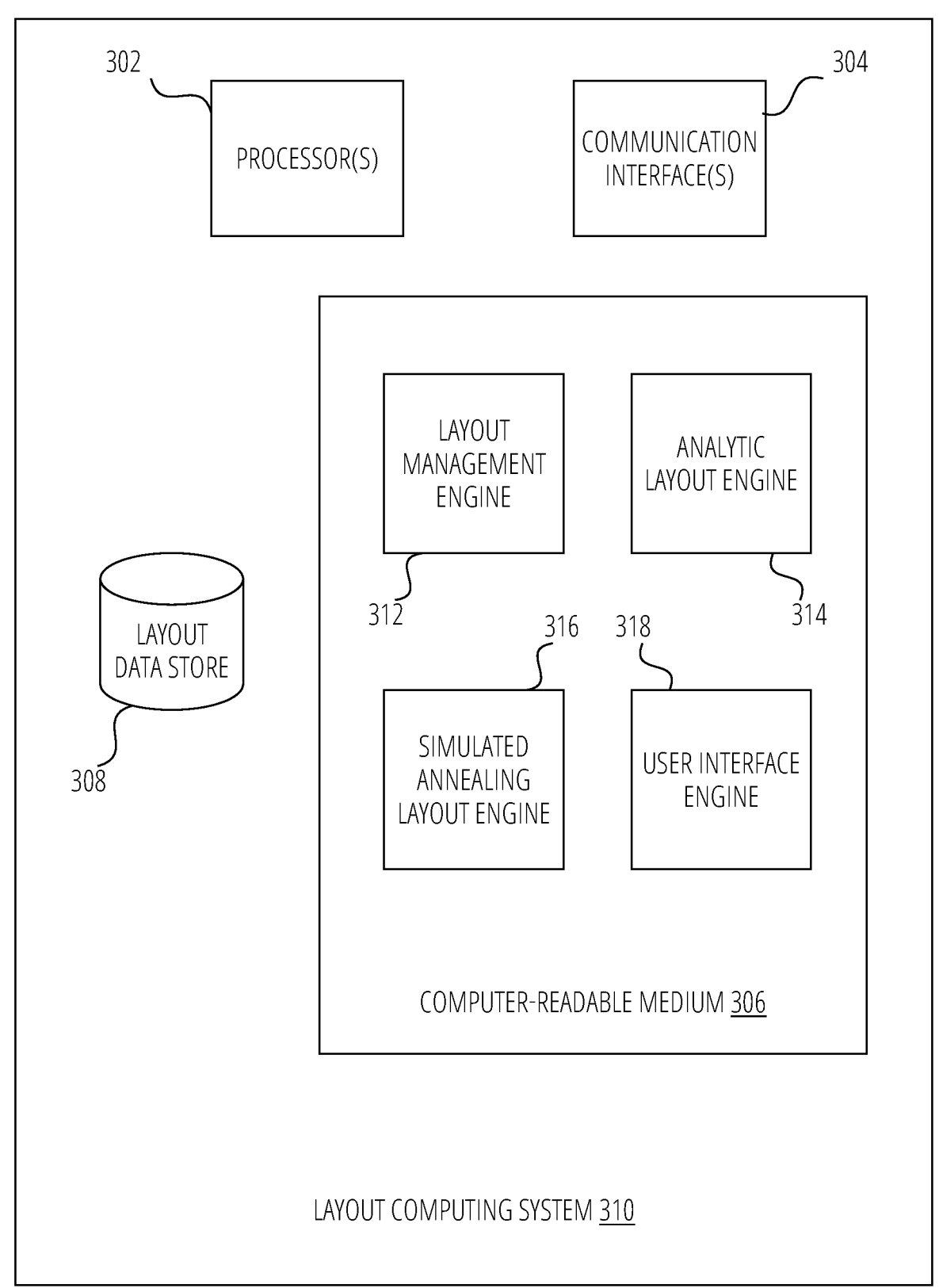
FIG. 3 is a block diagram that illustrates aspects of a non-limiting example embodiment of a layout computing system according to various aspects of the present disclosure.

FIG. 3 is a block diagram that illustrates aspects of a non-limiting example embodiment of a layout computing system according to various aspects of the present disclosure. The illustrated layout computing system 310 may be implemented by any computing device or collection of computing devices, including but not limited to one or more of a desktop computing device, a laptop computing device, a mobile computing device, a server computing device, a computing device of a cloud computing system, and/or combinations thereof. The layout computing system 310 is configured to receive a netlist that specifies a plurality of components and to optimize a layout of the components in the netlist. In some embodiments, the layout computing system 310 may provide a user interface that allows manual revisions to the optimized layout. In some embodiments, the layout computing system 310 may provide the optimized layout to a fabrication system for fabricating the represented integrated circuit.

As shown, the layout computing system 310 includes one or more processors 302, one or more communication interfaces 304, a layout data store 308, and a computer-readable medium 306.

In some embodiments, the processors 302 may include any suitable type of general-purpose computer processor. In some embodiments, the processors 302 may include one or more special-purpose computer processors or AI accelerators optimized for specific computing tasks, including but not limited to graphical processing units (GPUs), vision processing units (VPTs), and tensor processing units (TPUs).

In some embodiments, the communication interfaces 304 include one or more hardware and or software interfaces suitable for providing communication links between components. The communication interfaces 304 may support one or more wired communication technologies (including but not limited to Ethernet, FireWire, and USB), one or more wireless communication technologies (including but not limited to Wi-Fi, WiMAX, Bluetooth, 2G, 3G, 4G, 5G, and LTE), and/or combinations thereof.

As shown, the computer-readable medium 306 has stored thereon logic that, in response to execution by the one or more processors 302, cause the layout computing system 310 to provide a layout management engine 312, an analytic layout engine 314, a simulated annealing layout engine 316, and a user interface engine 318.

As used herein, "computer-readable medium" refers to a removable or nonremovable device that implements any technology capable of storing information in a volatile or non-volatile manner to be read by a processor of a computing device, including but not limited to: a hard drive; a flash memory; a solid state drive; random-access memory (RAM); read-only memory (ROM); a CD-ROM, a DVD, or other disk storage; a magnetic cassette; a magnetic tape; and a magnetic disk storage.

In some embodiments, the layout management engine 312 is configured to receive netlists and manage the layout optimization process performed by other components of the layout computing system 310 before storing optimized layouts in the layout data store 308. In some embodiments, the user interface engine 318 is configured to generate visual presentations of optimized layouts stored in the layout data store 308, and to receive and process manual adjustments to the optimized layouts.

In some embodiments, the analytic layout engine 314 is configured to generate rough layouts using analytical techniques. In some embodiments, the simulated annealing layout engine 316 is configured to generate rough layouts using simulated annealing techniques. The analytical techniques and the simulated annealing techniques are alternates, and so in some embodiments, only one or the other of the analytic layout engine 314 and the simulated annealing layout engine 316 may be present.

Further description of the configuration of each of these components is provided below.

As used herein, "engine" refers to logic embodied in hardware or software instructions, which can be written in one or more programming languages, including but not limited to C, C++, C#, COBOL, JAVA™, PHP, Perl, HTML, CSS, JavaScript, VBScript, ASPX, Go, and Python. An engine may be compiled into executable programs or written in interpreted programming languages. Software engines may be callable from other engines or from themselves. Generally, the engines described herein refer to logical modules that can be merged with other engines, or can be divided into sub-engines. The engines can be implemented by logic stored in any type of computer-readable medium or computer storage device and be stored on and executed by one or more general purpose computers, thus creating a special purpose computer configured to provide the engine or the functionality thereof. The engines can be implemented by logic programmed into an application-specific integrated circuit (ASIC), a field-programmable gate array (FPGA), or another hardware device.

As used herein, "data store" refers to any suitable device configured to store data for access by a computing device. One example of a data store is a highly reliable, high-speed relational database management system (DBMS) executing on one or more computing devices and accessible over a high-speed network. Another example of a data store is a key-value store. However, any other suitable storage technique and/or device capable of quickly and reliably providing the stored data in response to queries may be used, and the computing device may be accessible locally instead of over a network, or may be provided as a cloud-based service. A data store may also include data stored in an organized manner on a computer-readable storage medium, such as a hard disk drive, a flash memory, RAM, ROM, or any other type of computer-readable storage medium. One of ordinary skill in the art will recognize that separate data stores described herein may be combined into a single data store, and/or a single data store described herein may be separated into multiple data stores, without departing from the scope of the present disclosure.

FIG. 4 is a flowchart that illustrates a non-limiting example embodiment of a method of laying out a plurality of transistors for fabrication of an integrated circuit according to various aspects of the present disclosure. In the method 400, analytic techniques or simulated annealing techniques are used for optimizing an entire transistor layout to generate a rough placement. This rough placement, which is globally more optimized than would be possible using previous techniques, is then partitioned to generate a completed design suitable for fabrication.

From a start block, the method 400 proceeds to block 402, where a layout management engine 312 of a layout computing system 310 receives a specification for an integrated circuit that includes a netlist. In some embodiments, entries in the netlist include information about transistors in the integrated circuit, including but not limited to a type for each transistor (e.g., NMOS or PMOS) and identifications of nets connected to each terminal of each transistor. In some embodiments, the specification may also identify additional characteristics of the integrated circuit, including but not limited to a footprint for the integrated circuit, and physical limitations for various portions of the footprint (e.g., regions where only NMOS transistors are allowed to be placed and regions where only PMOS transistors are allowed to be placed, etc.). In some embodiments, the specification includes a transistor list, with the nets included as metadata in the list. In some embodiments, the specification may be, may include, or may be included in a data structure such as an integrated circuit configuration file.

At block 404, the layout management engine 312 determines initial locations on a canvas for transistors in the netlist. In some embodiments, a size and/or dimensions of the canvas may be determined by the information provided by the specification. The initial locations on the canvas may be specified in a continuous coordinate system (e.g., horizontal and vertical coordinates of each transistor may be specified with real number values instead of or in addition to integer values). In some embodiments, the initial locations may be randomly distributed throughout the canvas, may be randomly distributed with weighting applied for transistors connected to matching nets, may be an output of another type of optimization, or may be distributed using any other suitable technique.

Figure 5:
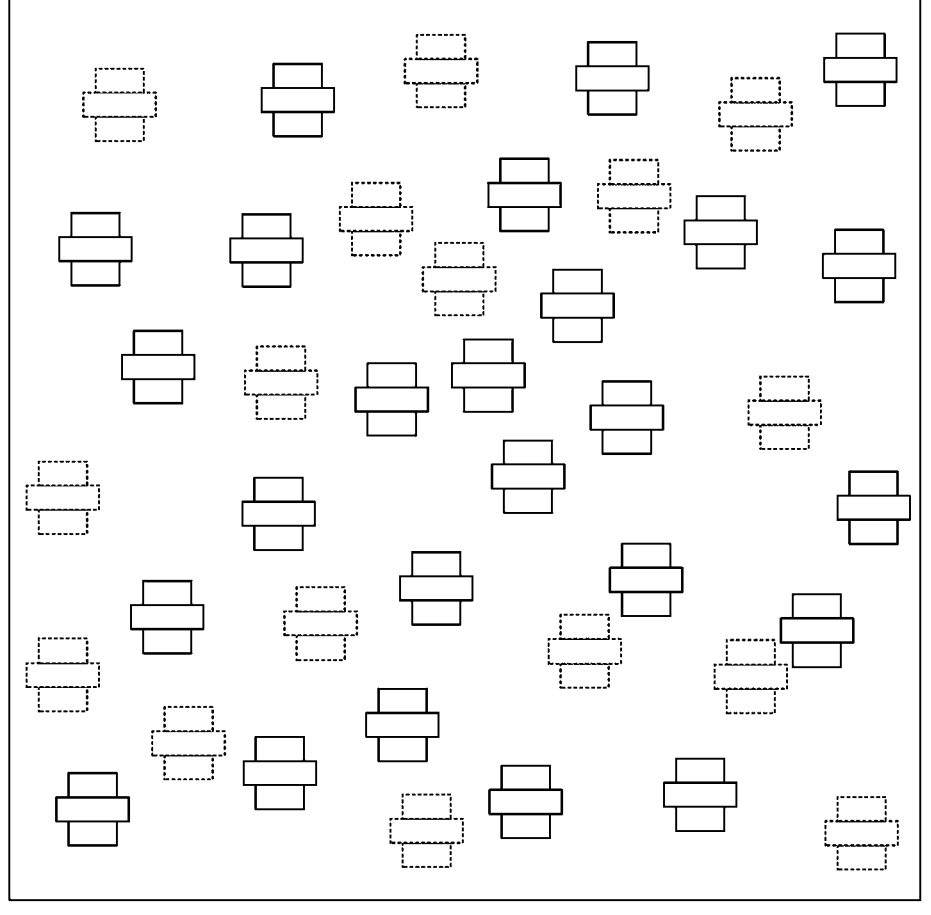
FIG. 5 is a schematic illustration of a non-limiting example embodiment of a canvas after initial locations for the transistors have been determined according to various aspects of the present disclosure

FIG. 5 is a schematic illustration of a non-limiting example embodiment of a canvas after initial locations for the transistors have been determined according to various aspects of the present disclosure. As shown, NMOS transistors (illustrated in solid lines) and PMOS transistors (illustrated in dashed lines) have been arranged randomly throughout the canvas 502. As is also shown, the transistors are arranged in using a continuous coordinate system, which is evident by the overlapping horizontal and vertical nature of the positions. The initial locations may or may not be valid positions from a fabricability perspective, but serve as an initial state for the subsequent optimizations.

Returning to FIG. 4, the method 400 then proceeds to subroutine block 406, where a procedure is conducted wherein the layout management engine 312 provides the canvas to an analytic layout engine 314 of the layout computing system 310 or a simulated annealing layout engine 316 of the layout computing system 310 to generate a rough placement that includes optimizing orientation of the transistors. One aspect of laying out transistors compared to laying out other types of components (e.g., cells) is that a three-terminal transistor can be arranged in one of at least two orientations. For example, in FIG. 1, the terminal on the left of the NMOS transistor coupled to net N1 may be the source terminal and the terminal on the right of the NMOS transistor coupled to net N3 may be the drain terminal. However, when laying out this transistor, it may be flipped such that the drain terminal coupled to N3 is arranged on the left while the source terminal coupled to N1 is arranged on the right. In embodiments of the present disclosure, in addition to considering locations, the optimization that generates the rough placement may consider flipping one or more transistors in order to improve the overall layout.

In some embodiments, the rough placement is in a discretized coordinate system (e.g., horizontal and vertical coordinates of each transistor are specified with integer values) instead of the continuous coordinate system used for the initial placement. The discretized coordinate system may be used as input in future steps of the method 400 (including but not limited to the fabrication system), and so the procedure executed at subroutine block 406 may convert from the continuous coordinate system to the discretized coordinate system to generate the rough placement to enable the later actions of the method 400.

A non-limiting example embodiment of a suitable procedure conducted by the analytic layout engine 314 to generate the rough placement using analytic techniques is illustrated in FIG. 6. A non-limiting example embodiment of a suitable procedure conducted by the simulated annealing layout engine 316 to generate the rough placement using simulated annealing techniques is illustrated in FIG. 8. Both example procedures are discussed in further detail below.

At block 408, the layout management engine 312 partitions and optimizes the rough placement to generate a fine placement. In some embodiments, one or more traditional techniques applied for transistor-level optimization may be used to optimize the partitions, including but not limited to general combinatorial search schemes including but not limited to Satisfiability Modulo Theory (SMT), Mixed Integer Programming (MIP), graph search, branch-and-bound, and dynamic programming. Power, performance, and area optimization factors can be approximated by other objectives, including but not limited to interconnection length and diffusion sharing.

At block 410, the layout management engine 312 routes the fine placement to generate a completed design. Any suitable router may be used, including but not limited to a maze router, a line-probe router, a pattern router, a channel router, or a gridless router, and any suitable routing technique may be used, including but not limited to a rip-up and reroute technique or an iterative-improvement routing method. Techniques for routing a fine placement to generate a completed design are known to those of ordinary skill in the art, and so are not described in further detail herein for the sake of brevity.

Placement and routing are described in blocks 406-410 as separate tasks for the sake of clarity, as determining locations for the transistors and determining routes for the connections between the transistors are two goals of the method 400. However, placement and routing may be considered separate, related aspects of the single problem of integrated circuit design that may affect each other. Accordingly, in some embodiments, the placement steps may be followed by a routing step, which may then be followed by another iteration of one or more of the placement steps (such as, for example, if the initial placement is determined to not be routable at the routing step), and so on. Further, in some embodiments, the placement and routing problems may be considered concurrently by a combinatorial optimizer, with at least some blocks of the integrated circuit being placed and routed at the same time.

At block 412, the layout management engine 312 stores the completed design in a layout data store 308 of the layout computing system 310. In some embodiments, the layout management engine 312 may not store the completed design in the layout data store 308, but instead may immediately pass it to other components of the layout computing system 310. However, by storing the completed design in the layout data store 308, the layout computing system 310 may be able to update or reuse the completed design without having to repeat the optimization steps described above.

At block 414, a user interface engine 318 of the layout computing system 310 presents the completed design, receives one or more manual updates to the completed design, and stores the updated design in the layout data store 308. Often, it may be desired to make manual adjustments to the completed design. For example, a user may wish to add one or more components to the completed design, remove one or more components from the completed design, add input or output ports or vias to the completed design to allow the resultant integrated circuit to communicate with other devices, adjust a position of one or more components to better interoperate with other devices, and/or make various other types of changes. In some embodiments, the user interface engine 318 receives indicates of such changes and adjusts the completed design in response while ensuring that any design rules remain met.

In some embodiments, the user interface can include an interactive and/or searchable transistor map that can be used to identify transistors that are connected or otherwise grouped (e.g., into a Boolean logic function) that would conventionally be replaced in a mapping by a cell representation. To that end, the user interface can include a search tool configured to query the completed design and to return a subset of transistors and/or nets in accordance with the query terms. The user interface may update the presentation of the transistor map to visually emphasize the subset of transistors and/or nets that match the query terms. Additionally or alternatively, the user interface can also include data or information useful for a user of the environment, such as a value of the objective function/loss function as a function of iteration number to judge convergence, a qualitative or quantitative determination of convergence, or the like. Similarly, the layout management engine 312 can interact with the user interface to facilitate at least partial manual input with respect to one or more transistors. For example, between iterations of automated modification, a user can insert additional transistors, remove transistors, modify the net list, manually reconfigure coordinate(s) and/or orientation(s) of transistor(s), and/or add soft or hard region fences around groups of transistors.

At block 416, the layout management engine 312 provides the design from the layout data store 308 to a fabrication system to fabricate the integrated circuit. Any type of fabrication system capable of fabricating integrated circuits, including but not limited to a photolithography system, may be used.

The method 400 then proceeds to an end block and terminates.

FIG. 6 illustrates a non-limiting example embodiment of a procedure for generating a rough layout using analytic techniques according to various aspects of the present disclosure. In the procedure 600, analytic techniques take advantage of the differentiability of operations over the continuous coordinate space to optimize the locations of the transistors, and then convert the locations in the continuous coordinate space to locations in a discretize coordinate space for use by further actions of the calling method 400.

From a start block, the procedure 600 advances to block 602, where the analytic layout engine 314 conducts an optimization of the transistor locations in a continuous coordinate space using a loss function that may include a term for orientations of the transistors.

In some embodiments, the optimization minimizes a value of the loss function (also referred to as an objective function) by perturbing design points (e.g., the locations of the transistors within the continuous coordinate space) until a minimum of the value is found (or until a predetermined number of iterations have been performed). In some embodiments, perturbing design points includes flipping orientations of one or more transistors. In some embodiments, the loss function may include a term that represents orientation of one or more transistors. A subsequent design point may be found using any suitable optimization technique, including but not limited to gradient descent, genetic algorithms, and combinations thereof. The use of the continuous coordinate space at this point in the procedure 600 allows iterative techniques such as gradient descent to be effective, even though the locations in the continuous coordinate space cannot be used for fabrication.

The loss function may include one or more terms as convergence objectives. An illustrative example of a convergence objective for the optimization is the weighted sum of half-perimeter wire length (HPWL). With respect to the weighting factor, $w_{ij}$ is defined as a weight for a net, for which the weighted sum of HPWL is formulated as $\Sigma w_{ij}*$ $(|x_i-x_j|+|y_i-y_j|)$, which can be approximated using quadratic or other non-linear objectives (e.g., the distance can be constrained to rectilinear routing conventions, can use shortest linear path, can include curvilinear conventions that incorporate manufacturability limits on radius of curvature, etc.). Additional or alternative convergence objectives include but are not limited to interconnection length, transistor density, routability, timing, power, manufacturability, among others.

The objective can be used to approximate power, performance, and area optimization factors. The weighting factor $w_{ij}$ may be net specific for a given net, connecting transistor "i" and "j." In some embodiments, a given net can connect more than two transistors. As such, weighting factor $w_{ijk}$ may be defined for a net connected to three transistors, with logical extension to nets that connect more than three transistors. In some embodiments, transistor specific weighting is applied, such that a given transistor "i" can be assigned a weight that makes it relatively more or less influential on the overall placement of the set of transistors. For example, where transistor density is used as an objective function, individual transistors can be attributed respective weights $w_i$.

In some embodiments, the weights $w_i$ can be defined in terms of a density function $d_i$ that defines a numerical probability for a transistor to be placed in a given matrix space. The density function $d_i$ can also be at least partially dependent on the number of transistors within a given spacing of transistor $t_i$ (e.g., such that the probability of placing transistor $t_i$ decreases with an increasing density of transistors in a given region of the placement matrix).

In some embodiments, one or more constraints can be applied to prevent convergence of the transistor placement matrix to a non-physical solution (e.g., two different transistors occupying the same physical space). For example, a transistor can be assigned a size in the coordinate space and/or an exclusion radius in the coordinate space (e.g., a zero-dimensional size with a (1,1) exclusion radius), where the term "exclusion radius" refers to a spacing around a given transistor "i" within which no other transistor "j" is permitted. The spacing can be defined in terms of spatial dimensions (e.g., in physical terms in a two-dimensional plane) or in the coordinate space (e.g., in index terms relative to the coordinate of the transistor). In an illustrative example, a transistor $t_i$ can be attributed an exclusion radius of two grid spacings in x-y space, such that a second transistor $t_j$ will not be assigned a coordinate up to two units distant from the position of the transistor. In some embodiments, each transistor in the set of transistors can be assigned the same size, corresponding to the physical condition of transistors in fabricated integrated circuits. In some embodiments, transistors are be assigned different sizes and/or exclusion distances.

As an approach to reducing computational complexity of applying constraints, an objective function (e.g., the HPWL described above) can be modified to include a penalty term. For example, constraints on physical space (e.g., non-overlapping transistor rules) can be relaxed into the objective function using penalty terms. Similarly, a local refinement step can be included to optimize transistor placement, for example, as part of a power, performance, and/or area optimization. In an illustrative example, a subset of transistors can be translated or otherwise displaced as part of reducing the overall area of an integrated circuit including thousands of transistors.

Once the optimal locations and orientations have been determined by the optimization technique at block 602, the procedure 600 then converts the locations from the continuous coordinate space to the discrete coordinate space. Accordingly, the procedure 600 advances to block 604, where the analytic layout engine 314 sorts the transistors in the continuous coordinate space in a horizontal direction and a vertical direction. To do so, the analytic layout engine 314 may compare the locations of the transistors to each other, and may create two lists: a first list with the transistors sorted in order based on their locations on a horizontal axis, and a second list with the transistors sorted in order based on their locations on a vertical axis. If more or fewer dimensions are present in the location, additional lists may be used.

At block 606, the analytic layout engine 314 places the transistors in a plurality of rows of a discrete coordinate space according to the sort in the vertical direction and in a plurality of columns of the discrete coordinate space according to the sort in the horizontal direction to generate a preliminary discrete layout. In some embodiments, the analytic layout engine 314 may determine a number of available rows in the discrete coordinate space, and may determine a number of transistors to be placed in each row to evenly distribute the transistors throughout the rows, and a number of transistors to be placed in each column to evenly distribute the transistors throughout the columns. The analytic layout engine 314 may then process the list of transistors sorted by vertical location to place the transistors in the rows (e.g., if three transistors are to be placed in each row, the first three transistors in the list are assigned to the first row, the next three transistors in the list are assigned to the second row, and so on), and then similarly process the list of transistors sorted by horizontal location to place the transistors in the columns (e.g., if five transistors are to be placed in each column, the first five transistors in the list are placed in the first column, the next five transistors are placed in the second column, and so on). In some embodiments, certain locations may be limited to certain types of transistors (e.g., PMOS vs. NMOS), and so the placement at this point may take these constraints (and/or other fabricability constraints) into consideration.

Figure 7:
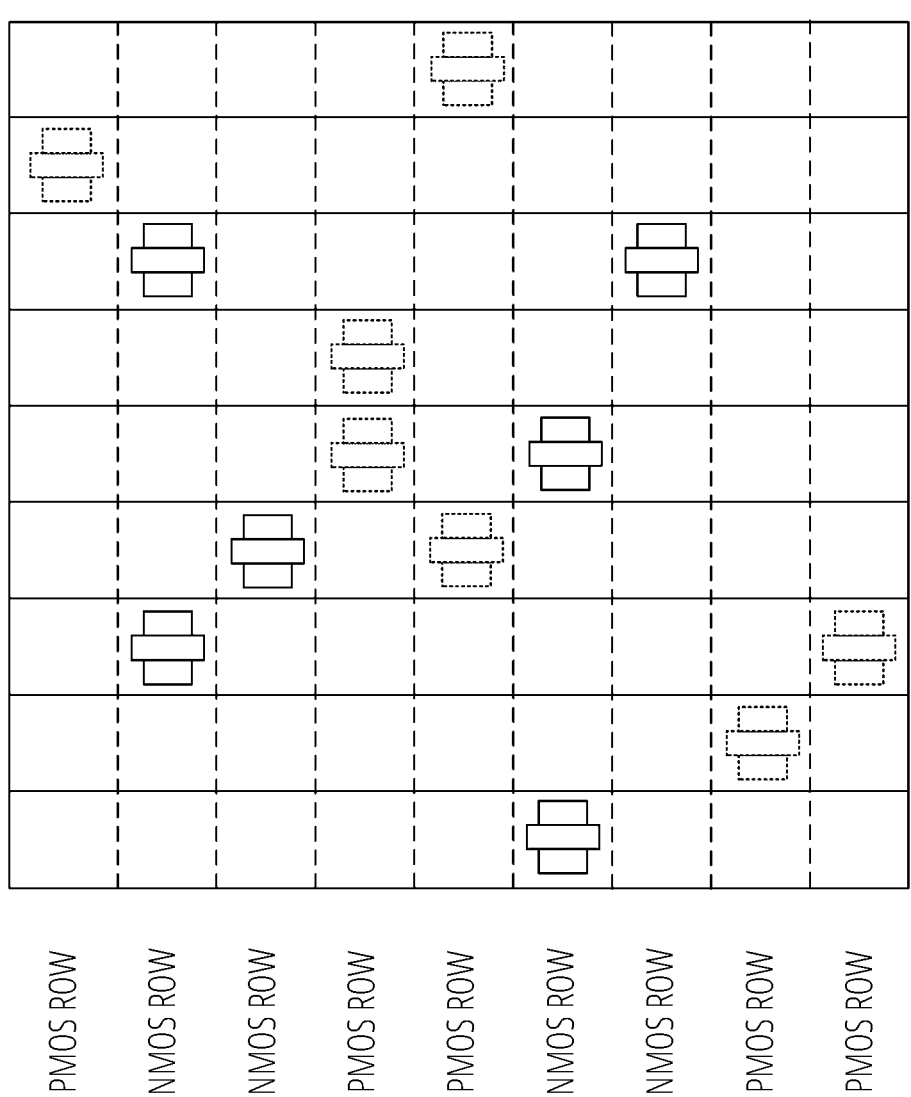
FIG. 7 is a schematic illustration of a non-limiting example embodiment of a layout in a discrete coordinate space according to various aspects of the present disclosure.

FIG. 7 is a schematic illustration of a non-limiting example embodiment of a layout in a discrete coordinate space according to various aspects of the present disclosure. In the layout 702, the canvas has been divided into discrete rows and columns. The rows include pairs of rows in which only PMOS transistors (illustrated in dashed lines) may be placed, and pairs of rows in which only NMOS transistors (illustrated in solid lines) may be placed. The actions of block 606 distributed the transistors amongst the discrete locations defined by the rows and columns.

Returning to FIG. 6, at block 608, the analytic layout engine 314 uses a combinatorial optimizer that may consider orientations of the transistors to convert the preliminary discrete layout into the rough layout. In order to complete the combinatorial optimization in a reasonable time, the discrete coordinate space may be partitioned into smaller areas as in traditional techniques. Even though applying combinatorial optimization techniques to smaller partitions of a larger layout problem in order to reduce the problem to a reasonable size, previous techniques do not first apply the global optimization described above, and so are not usable for laying out large numbers of individual transistors in integrated circuit design because the partitioned optimizations will not be effective for the overall design. Since those of ordinary skill in the art are familiar with applying combinatorial techniques to small partitions of integrated circuit designs, further details of these actions are not described herein for the sake of brevity.

The procedure 600 then advances to an end block and returns control to its caller.

FIG. 8 is a flowchart that illustrates a non-limiting example embodiment of a procedure for generating a rough layout using a simulated annealing technique according to various aspects of the present disclosure. In the procedure 800, simulated annealing techniques that can operate efficiently over a discrete coordinate space are used to optimize the locations of the transistors.

From a start block, the procedure 800 advances to block 802, where the simulated annealing layout engine 316 converts the initial locations of the transistors to a discrete coordinate space. In some embodiments, a sorting technique such as that described in blocks 604-606 of FIG. 6 may be used to convert from a continuous coordinate space of the initial locations to the discrete coordinate space. In some embodiments, the initial locations may be provided in the discrete coordinate space directly.

At block 804, the simulated annealing layout engine 316 conducts an optimization of the locations of the transistors within the discrete coordinate space using a simulated annealing technique to create a preliminary discrete layout, wherein moves of the simulated annealing technique may include changing orientations of the transistors. In the simulated annealing technique, a loss function similar to that described in block 602 may be optimized, but instead of using gradient techniques to perturb the design points, iterations are performed where one or more neighbors of a present state are evaluated using the loss function, and a probabilistic decision is made to decide whether to move to a neighbor state or remain in the present state. The neighbors are determined by changing a location of one or more transistors, and may also include changing an orientation of one or more transistors.

At block 806, the simulated annealing layout engine 316 uses a combinatorial optimizer to convert the preliminary discrete layout into the rough layout. As in block 608, traditional partitioning and combinatorial optimization techniques may be used to convert the preliminary discrete layout to the rough layout.

The procedure 800 then advances to an end block and returns control to its caller.

As part of the techniques described herein, analytical formulations for standard-cell-based placement can be adapted for transistor-level placement. For example, orientation, grouping, routability constraints, and/or group-respective weighting can be implemented to introduce added flexibility to transistor placement. In contrast to the standard-cell hierarchy that is conventionally applied in industry, transistor level placement improves optimization processes by decoupling transistor position from Boolean logic function grouping. In this way, local deviations from optimum placement can be balanced against aggregate improvements to an overall arrangement of transistors.

In contrast, conventional tools are restricted to placement of standard cells rather than transistors, limiting the flexibility with respect to placement of individual transistors on the scale of the integrated circuit, thereby prioritizing cell-scale optimization over IC-scale optimization. As such, placing transistors directly at the scale of greater than 1000 transistors were previously rare and manual practices.

In the preceding description, numerous specific details are set forth to provide a thorough understanding of various embodiments of the present disclosure. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The order in which some or all of the blocks appear in each method flowchart should not be deemed limiting. Rather, one of ordinary skill in the art having the benefit of the present disclosure will understand that actions associated with some of the blocks may be executed in a variety of orders not illustrated, or even in parallel.

The processes explained above are described in terms of computer software and hardware. The techniques described may constitute machine-executable instructions embodied within a tangible or non-transitory machine (e.g., computer) readable storage medium, that when executed by a machine will cause the machine to perform the operations described. Additionally, the processes may be embodied within hardware, such as an application specific integrated circuit ("ASIC") or otherwise.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A computer-implemented method for designing an integrated circuit using transistor placement optimization, the method comprising:

receiving, by a computing system, a specification for the integrated circuit, wherein the specification includes a netlist describing a plurality of transistors and connections between terminals of the plurality of transistors;

determining, by the computing system, an initial location and an orientation on a canvas for each transistor in the plurality of transistors;

using, by the computing system, an objective function based at least in part on the initial locations and the orientations of the plurality of transistors to generate a rough placement having globally optimized locations and orientations for the plurality of transistors;

using, by the computing system, a local refinement technique to optimize the rough placement to generate a fine placement;

using, by the computing system, a routing technique to generate a routing for the fine placement to generate a completed design; and storing, by the computing system, the completed design in a layout data store.

2. The computer-implemented method of claim 1, further comprising providing the completed design to a fabrication system for fabrication of the integrated circuit.

3. The computer-implemented method of claim 1, further comprising:

generating a user interface based on at least one of the rough placement, the fine placement, and the completed design;

receiving a query, via the user interface, that includes one or more query terms; and updating the user interface to visually emphasize at least one of a subset of transistors or a subset of nets that match the query terms.

4. The computer-implemented method of claim 3, further comprising:

receiving, via the user interface, an instruction to add a transistor, remove a transistor, modify the netlist, modify a location of a transistor, modify an orientation of a transistor, or add a region fence around a group of transistors; and updating at least one of the rough placement, the fine placement, and the completed design based on the instruction.

5. The computer-implemented method of claim 1, wherein using the objective function to generate a rough placement having globally optimized locations and orientations for the plurality of transistors includes:

using a simulated annealing technique to optimize locations of the plurality of transistors in a discrete coordinate space.

6. The computer-implemented method of claim 5, wherein at least one move of the simulated annealing technique includes modifying an orientation of at least one transistor.

7. The computer-implemented method of claim 1, wherein the objective function comprises a weighted half-perimeter wire length (HPWL) function.

8. A computer-implemented method for designing an integrated circuit using transistor placement optimization, the method comprising:

receiving, by a computing system, a specification for the integrated circuit, wherein the specification includes a netlist describing a plurality of transistors and connections between terminals of the plurality of transistors;

determining, by the computing system, an initial location and an orientation on a canvas for each transistor in the plurality of transistors;

using, by the computing system, an objective function based at least in part on the initial locations and the orientations of the plurality of transistors to generate a rough placement having globally optimized locations and orientations for the plurality of transistors;

using, by the computing system, a local refinement technique to optimize the rough placement to generate a fine placement;

using, by the computing system, a routing technique to generate a routing for the fine placement to generate a completed design; and storing, by the computing system, the completed design in a layout data store;

wherein using the objective function to generate the rough placement having globally optimized locations and orientations for the plurality of transistors includes:

using an analytic technique to optimize locations of the plurality of transistors in a continuous coordinate space; and creating a preliminary discrete layout by converting the optimized locations of the plurality of transistors in the continuous coordinate space to locations in a discrete coordinate space.

9. The computer-implemented method of claim 8, wherein converting the optimized locations of the plurality of transistors in the continuous coordinate space to locations in the discrete coordinate space includes:

creating a sorted list of the plurality of transistors for each dimension of the canvas, wherein the sorted list is arranged by the location in a corresponding dimension of the optimized location of each transistor; and placing the plurality of transistors in the discrete coordinate space according to the sorted lists.

10. The computer-implemented method of claim 8, wherein the analytic technique includes a gradient descent technique.

11. A non-transitory computer-readable medium having computer-executable instructions stored thereon that, in response to execution by one or more processors of a computing system, cause the computing system to perform actions for designing an integrated circuit using transistor placement optimization, the actions comprising:

receiving, by the computing system, a specification for the integrated circuit, wherein the specification includes a netlist describing a plurality of transistors and connections between terminals of the plurality of transistors;

determining, by the computing system, an initial location and an orientation on a canvas for each transistor in the plurality of transistors;

using, by the computing system, an objective function based at least in part on the initial locations and the orientations of the plurality of transistors to generate a rough placement having globally optimized locations and orientations for the plurality of transistors;

using, by the computing system, a local refinement technique to optimize the rough placement to generate a fine placement;

using, by the computing system, a routing technique to generate a routing for the fine placement to generate a completed design; and storing, by the computing system, the completed design in a layout data store.

12. The non-transitory computer-readable medium of claim 11, wherein the actions further comprise providing the completed design to a fabrication system for fabrication of the integrated circuit.

13. The non-transitory computer-readable medium of claim 11, wherein the actions further comprise:

generating a user interface based on at least one of the rough placement, the fine placement, and the completed design;

receiving a query, via the user interface, that includes one or more query terms; and updating the user interface to visually emphasize at least one of a subset of transistors or a subset of nets that match the query terms.

14. The non-transitory computer-readable medium of claim 13, wherein the actions further comprise:

receiving, via the user interface, an instruction to add a transistor, remove a transistor, modify the netlist, modify a location of a transistor, modify an orientation of a transistor, or add a region fence around a group of transistors; and updating at least one of the rough placement, the fine placement, and the completed design based on the instruction.

15. The non-transitory computer-readable medium of claim 11, wherein using the objective function to generate a rough placement having globally optimized locations and orientations for the plurality of transistors includes:

using a simulated annealing technique to optimize locations of the plurality of transistors in a discrete coordinate space.

16. The non-transitory computer-readable medium of claim 15, wherein at least one move of the simulated annealing technique includes modifying an orientation of at least one transistor.

17. The non-transitory computer-readable medium of claim 11, wherein the objective function comprises a weighted half-perimeter wire length (HPWL) function.

18. A non-transitory computer-readable medium having computer-executable instructions stored thereon that, in response to execution by one or more processors of a computing system, cause the computing system to perform actions for designing an integrated circuit using transistor placement optimization, the actions comprising:

receiving, by the computing system, a specification for the integrated circuit, wherein the specification includes a netlist describing a plurality of transistors and connections between terminals of the plurality of transistors;

determining, by the computing system, an initial location and an orientation on a canvas for each transistor in the plurality of transistors;

using, by the computing system, an objective function based at least in part on the initial locations and the orientations of the plurality of transistors to generate a rough placement having globally optimized locations and orientations for the plurality of transistors;

using, by the computing system, a local refinement technique to optimize the rough placement to generate a fine placement;

using, by the computing system, a routing technique to generate a routing for the fine placement to generate a completed design; and storing, by the computing system, the completed design in a layout data store wherein using the objective function to generate the rough placement having globally optimized locations and orientations for the plurality of transistors includes:

using an analytic technique to optimize locations of the plurality of transistors in a continuous coordinate space; and creating a preliminary discrete layout by converting the optimized locations of the plurality of transistors in the continuous coordinate space to locations in a discrete coordinate space.

19. The non-transitory computer-readable medium of claim 18, wherein converting the optimized locations of the plurality of transistors in the continuous coordinate space to locations in the discrete coordinate space includes:

creating a sorted list of the plurality of transistors for each dimension of the canvas, wherein the sorted list is arranged by the location in a corresponding dimension of the optimized location of each transistor; and placing the plurality of transistors in the discrete coordinate space according to the sorted lists.

20. The non-transitory computer-readable medium of claim 18, wherein the analytic technique includes a gradient descent technique.

* * * * *